United States Patent [19]
Shen et al.

[11] Patent Number: 5,913,979
[45] Date of Patent: Jun. 22, 1999

[54] METHOD FOR REMOVING SPIN-ON-GLASS AT WAFER EDGE

[75] Inventors: Chih-Heng Shen, Hsin-Chu; Hui-Tzu Lin, Taichung, both of Taiwan

[73] Assignee: Taiwan Semiconductor Manufacturing Co., Ltd, Hsin-Chu, Taiwan

[21] Appl. No.: 08/780,399

[22] Filed: Jan. 8, 1997

[51] Int. Cl.$^6$ ........................................ B08B 3/08
[52] U.S. Cl. ................... 134/2; 134/26; 134/32; 134/33; 134/25.4; 134/38; 134/42
[58] Field of Search ......................... 134/2, 26, 32, 134/33, 25.4, 38, 42

[56] References Cited

U.S. PATENT DOCUMENTS

| | | | |
|---|---|---|---|
| 5,451,291 | 9/1995 | Park et al. | 134/2 X |
| 5,454,970 | 10/1995 | Flaningam et al. | 134/38 X |
| 5,643,818 | 7/1997 | Sachdev et al. | 437/51 |
| 5,688,411 | 11/1997 | Kutsuzawa et al. | 134/32 X |

*Primary Examiner*—Zeinab El-Arini
*Attorney, Agent, or Firm*—Tung & Associates

[57] ABSTRACT

The present invention provides a method for removing unwanted coating layer at wafer edge by first immersing the wafer edge in a cleaning solution and then immersing in a rinsing solution such as deionized water to remove the residual cleaning solution from the surface of the wafer. The wafer can be dried in a subsequent spin dry process.

11 Claims, 1 Drawing Sheet

METHOD FOR REMOVING SPIN-ON-GLASS AT WAFER EDGE

FIELD OF THE INVENTION

The present invention generally relates to a method for removing unwanted coating layer from a semiconductor wafer and more particularly, relates to a method for removing spin-on-glass at wafer edge by a solvent immersion method.

BACKGROUND OF THE INVENTION

Spin-on-glass (SOG) is frequently used for gap fill and planarization of inter-level dielectrics (ILD) in multi-level metalization structures. It is a very suitable material for use in low-cost fabrication of IC circuits. Most commonly used SOG materials are of two basic types; an inorganic type of silicate based SOG and an organic type of siloxane based SOG. One of the commonly used organic type SOG materials is a silicon oxide based polysiloxane which is featured with radical groups replacing or attaching to oxygen atoms. Based on these two basic structures, the molecular weight, the viscosity and the desirable film properties of SOG can be modified and adjusted to suit the requirement of specific IC fabrication process.

SOG film is typically applied to a pre-deposited oxide surface as a liquid to fill gaps and steps on the substrate. Similar to the application method for photoresist films, a SOG material can be dispensed onto a wafer and spun with a rotational speed which determines the thickness of the SOG layer desired. After the film is evenly applied to the surface of the substrate, it is cured at a temperature of approximately 400° C. and then etched back to obtain a smooth surface in preparation for a capping oxide layer on which a second interlevel metal may be patterned. The purpose of the etch-back step is to leave SOG between metal lines but not on top of the metal, while the capping oxide layer is used to seal and protect SOG during further fabrication processes. The siloxane based SOG material is capable of filling 0.15 micron gaps and therefore it can be used in 0.25 micron technology.

When fully cured, silicate SOG has similar properties like those of silicon dioxide. Silicate SOG does not absorb water in significant quantity and is thermally stable. However, one disadvantage of silicate SOG is the large volume shrinkage during curing. As a result, the silicate SOG retains high stress and cracks easily during curing and further handling. The cracking of the SOG layer can cause a serious contamination problem for the fabrication process. The problem can sometimes be avoided by the application of only a thin layer, i.e., 1000~2000 Å of the silicate SOG material.

In the current SOG coating process, a solvent edge rinse and a solvent backside rinse process are utilized to remove unwanted SOG deposited on the wafer edge and on the backside of the wafer. This is shown in FIGS. 1~3. A semiconductor wafer 10 which has a flat side 12 is shown in FIG. 1. After a SOG coating process, a SOG layer 14 is blanket deposited on the top surface 16 of the wafer. The layer is deposited as a dielectric layer for insulating between metal lines. In order to process the wafer in subsequent fabrication steps, the wafer must be positioned in reaction chambers for various processes such as etching or deposition. In most of the process chambers, the wafer is positioned on a platform and held down on the edge by a wafer clamp. The function of the wafer clamp is to prevent the wafer from moving during the process when reactant gases or etching gases may be flowing into the reaction chamber.

To enable the wafer clamp to function properly, the edge portion of the wafer of approximately 2~4 mm wide must be cleaned without any coated material. This edge area 22 on wafer 10 is shown in FIG. 1.

In present wafer fabrication technology, the SOG layer deposited at unintended areas of the wafer can be removed in two different processes. The first process is a solvent edge rinse which is shown in FIG. 2. In this process, wafer 10 is placed on a platform (not shown) and spun at a predetermined rotational speed along a spin axis 26. The rotational speed of the wafer can be suitably adjusted for each specific application depending on the thickness of the layer to be removed and the type of chemical solution used. As shown in FIG. 2, a chemical solution injector 28 is used to inject chemical solution 32 onto the top edge 34 of the wafer. The chemical solution 38 deflected from the edge 34 of the wafer hits the chamber wall 42 and drains to the bottom of the process chamber. The solvent edge rinse process is effective in removing a limited area, i.e., a width of 2~4 mm, on the top edge of the wafer of unwanted coating materials such as SOG or photoresist. However, as shown in FIG. 1, when wafer 10 is spun around its center on a rotational axis, the flat side 12 of the wafer is not touched by the injected solution 32 each time the wafer rotates. As a result, coating material 18 in the form of a bead remains on wafer 10.

The second cleaning process is a solvent backside rinse such as that shown in FIG. 3. The backside 48 of wafer 10 can be cleaned by this process. A cleaning solution 52 is injected from a spray nozzle 54 onto the backside 48 of the wafer. The process is also known as a centrifugal spray cleaning process wherein a chemical solution, i.e., normally a good solvent for the coating layer is pressure-fed and injected directly onto the backside of a spinning wafer. The process can be effectively used to reduce the volume of fresh chemical consumed and is normally faster than an immersion process. After the injected chemical solution 52 hits the bottom surface 48 of the wafer, the chemical solution 56 reflects from the backside 48 of the wafer and drains into the bottom of the process tank (not shown). During a normal backside rinse process, the sprayed chemical solution 52 is only capable of rinsing the backside 48 of the wafer and, none of the chemical solution 52 can reach the top surface 16. The bead 18 at the flat side 12 of the wafer is therefore not affected or cleaned in the backside rinse process.

Consequently, the SOG bead remains on the flat side of the wafer and eventually leads to SOG cracking during subsequent processes when a wafer clamp is pressed down on the SOG bead for mounting the wafer. The particles generated by the cracking of the SOG layer contaminate the surface of the wafer and is detrimental to the yield and the quality of the IC devices produced.

It is therefore an object of the present invention to provide a method for removing a coating layer from an unintended area of a wafer that does not have the drawbacks or shortcomings of the conventional cleaning methods.

It is another object of the present invention to provide a method for removing a coating layer from wafer flat side to eliminate the formation of a bead of the coating material.

It is a further object of the present invention to provide a method for removing a coating layer from an unintended area on the wafer flat edge such that the wafer can be processed in subsequent processes without producing particle contaminants.

It is another further object of the present invention to provide a method for removing a spin-on-glass material from a wafer flat edge such that a SOG build up at the flat edge can be avoided.

It is still another object of the present invention to provide a method for removing a SOG layer from wafer flat edge by utilizing a wafer immersion technique.

It is yet another object of the present invention to provide a method for removing a SOG coating layer from wafer flat edge by immersing the wafer in a solvent.

It is still another further object of the present invention to provide a method for removing a coating material from wafer flat edge by utilizing a solvent immersion method wherein a mixture of solvents is used depending on the coated material to be removed.

SUMMARY OF THE INVENTION

The present invention provides a method for effectively removing a coating material such as a SOG, a photoresist or an oxide layer from the wafer flat edge such that a build-up of the coating material and possible cracking in subsequent processing steps can be prevented.

In a preferred embodiment, the method for removing a coating layer from an unintended area on a wafer can be carried out by the steps of first providing a wafer that has an unwanted coating layer at the flat edge, providing a cleaning solution that contains at least $C_5H_{10}O_3$, immersing the wafer in the cleaning solution such that the planar surface of the wafer is substantially perpendicular to a top surface of the cleaning solution with at least the unwanted coating layer covered by the cleaning solution for a length of time sufficient to remove the coating layer, and immersing the wafer in deionized water to substantially remove the cleaning solution from the wafer. The unwanted coating layer to be removed can be a spin-on-glass layer, a photoresist layer or an oxide layer. The cleaning solution normally comprises $C_5H_{10}O_3$ and $C_3H_8O$. The wafer should be immersed in the cleaning solution to a suitable depth so that the coated material can be removed to a desirable width. The cleaning solution should be kept at temperature not less than the ambient temperature, while the depth of the solution should be strictly controlled. The preferred embodiment may further include the step of spin-drying the wafer after washing with deionized water to substantially remove the cleaning solution. By substantially removing the cleaning solution, it is meant that 95% of the cleaning solution on its surface is removed.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a novel method for removing an unwanted material layer from the surface of a wafer by immersing the unwanted material layer at the wafer flat side in a cleaning solution maintained at a suitable temperature.

Figure 1:
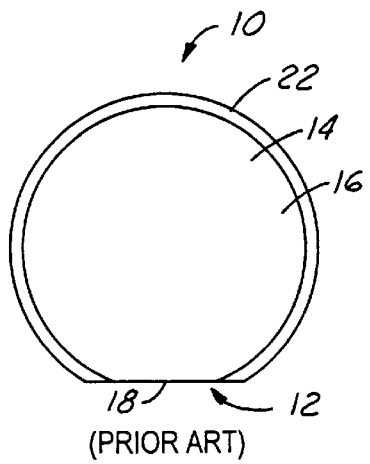
FIG. 1 is a top view of a conventional wafer that has a SOG bead built up at the flat edge of the wafer.
Figure 2:
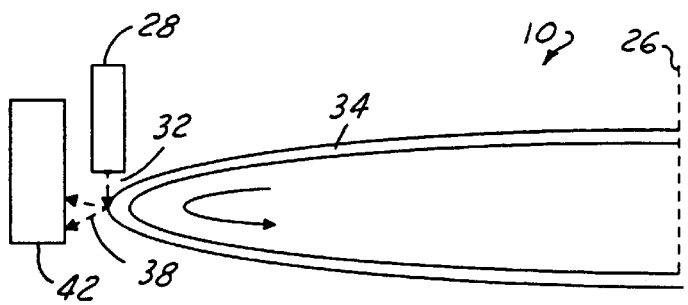
FIG. 2 is a perspective view illustrating a conventional method of solvent edge rinse on a wafer.
Figure 3:
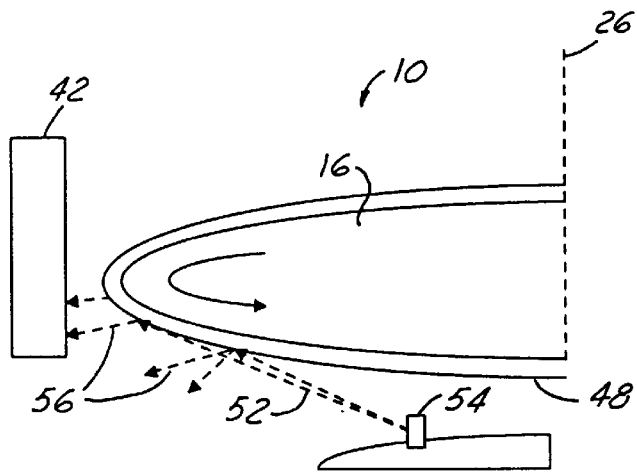
FIG. 3 is a perspective view illustrating a conventional method of solvent backside rinse on a wafer.
Figure 5:
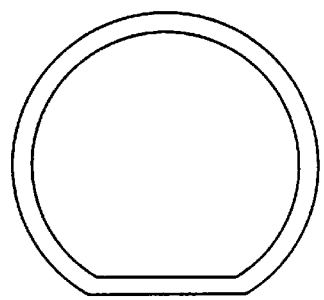
FIG. 5 is a top view of the present invention wafer having a flat edge after a cleaning process for the bead is carried out.
Figure 4:
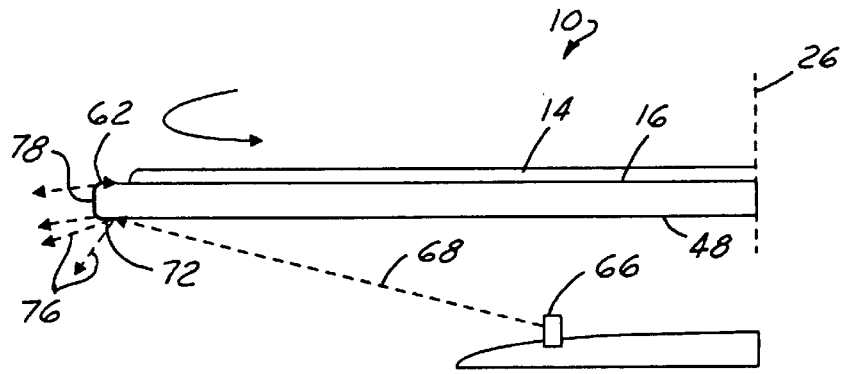
FIG. 4 is a side view illustrating the present invention method of immersing the bead on the flat area of a wafer in a cleaning solution.

Referring now to FIG. 4, where a present invention method of removing a SOG bead at the wafer flat side is shown. Wafer 60 is positioned in an immersion tank 70 containing a cleaning solution 72. The wafer flat edge 62 which has a coating bead 64 deposited thereon is immersed in the cleaning solution 72. A holding fixture (not shown) is normally used to hold the wafer such that only a predetermined section of the wafer flat edge is immersed in the cleaning solution. The immersion time required should be long enough to suffice complete removal of the coated bead. The immersion may further include the step of stirring the cleaning solution to improve its homogeneity.

A suitable cleaning solution used in the present invention novel method can be $C_5H_{10}O_3$, $C_3H_8O$, or a mixture thereof. The $C_5H_{10}O_3$ cleaning solvent is commonly known as EL-100, while the $C_3H_8O$ cleaning solvent is commonly known as IPA in the semiconductor fabrication industry.

Typical physical properties of EL-100 and IPA are illustrated in Table I.

TABLE I

|  | EL-100 | IPA |
|---|---|---|
| Molecular Formula | $C_5H_{10}O_3$ | $C_3H_8O$ |
| Flash Point (TCC) | 46° C. | 12° C. |
| Boiling Point | 154° C. | 82° C. |
| Specific Gravity | 1.03 at 20° C. | 0.785 at 20° C. |
| Evaporation Rate | 0 22 | 2.3 |
| Viscosity (cSt) | 2.51 | 3.98 |
| Vapor Pressure | 2.8 mmHg at 20° C. | 2.07 mmHg at 20° C. |

After the wafer is immersed in the cleaning solution and substantially all the unwanted SOG is removed, the wafer is immersed in a rinsing solution such as deionized water to remove the residual solvent on the surface of the wafer. The wafer can then be dried by a known method such as spin drying.

It should be noted that while EL-100 and IPA solvents are given as examples in the present invention method, the method is not limited to these two solvents. Other chemical solvents may also be suitably used as long as a coating bead of SOG, photoresist or oxide can be dissolved in a reasonable length of time when immersed in such solvent.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for removing spin-on-glass (SOG) deposited at wafer flat edge comprising the steps of:

providing a wafer having a SOG bead at the flag edge;

providing a cleaning solution consisting of isopropanol and ethyl lactate in an immersion tank;

holding the wafer in said cleaning solution in a fixed position with at least the SOG bead covered by the cleaning solution for a length of time sufficient to remove said bead; and immersing the wafer in deionized water to remove said cleaning solution from the wafer.

2. A method according to claim 1, wherein the step of holding the wafer in a fixed position in the cleaning solution comprises dipping the wafer so that a planar surface of the wafer is perpendicular to a top surface of said cleaning solution.

3. A method according to claim 1, wherein said wafer being held in the fixed position in said cleaning solution for a period of time such that said SOG bead is removed.

4. A method according to claim 1, wherein said cleaning solution being maintained at not less than ambient temperature.

5. A method according to claim 1, wherein said wafer being immersed in the deionized water for a time period sufficient to remove 95% of the cleaning solution on its surface.

6. A method according to claim 1 further comprising the step of spin-drying said wafer.

7. A method for removing a SOG layer from the edge of a wafer comprising the steps of:

providing a wafer having a SOG layer coated on at least one edge of the wafer;

providing a cleaning solution of a mixture of isopropanol and ethyl lactate;

exposing the at least one edge of the wafer having said SOG layer to said cleaning solution by holding said wafer in a fixed position for a time period sufficient to remove said layer; and removing said cleaning solution from the surface of said wafer by exposing said wafer surface to a rinsing solution.

8. A method according to claim 7, wherein said at least one edge of the wafer having SOG is exposed to said cleaning solution so that a planar surface of the wafer is perpendicular to a top surface of said clearing solution.

9. A method according to claim 7, wherein said surface of the wafer is exposed to the cleaning solution for a time period sufficient to remove said SOG layer.

10. A method according to claim 7, wherein said rinsing solution comprises deionized water.

11. A method according to claim 7, wherein said cleaning solution being maintained at a temperature not less than ambient temperature.

* * * * *